United States Patent [19]

Platt et al.

[11] Patent Number: 4,823,132
[45] Date of Patent: Apr. 18, 1989

[54] DEVICE FOR THE SIMULATION OF RADAR TARGETS IN LABORATORY TESTS OF RADAR SEEKERS

[76] Inventors: Karl E. Platt, Zum Kretzer 26; Nikolaus H. E. Scheerer, Frohsinnstrasse 18, both of 7770 Überlingen, Fed. Rep. of Germany

[21] Appl. No.: 145,520

[22] Filed: Jan. 19, 1988

[30] Foreign Application Priority Data

Jan. 21, 1987 [DE] Fed. Rep. of Germany ....... 3701535

[51] Int. Cl.[4] .............................................. G01S 7/40
[52] U.S. Cl. ........................................ 342/169; 434/2
[58] Field of Search ............... 342/169, 165, 166, 168, 342/173, 4; 434/1, 2, 5

[56] References Cited

U.S. PATENT DOCUMENTS

| | | | |
|---|---|---|---|
| 2,448,889 | 9/1948 | Johnson et al. | 342/166 X |
| 2,489,075 | 11/1949 | Bishop | 342/165 |
| 2,961,654 | 11/1960 | Simon | 342/165 |
| 2,977,590 | 3/1961 | Lovick | 342/166 |
| 3,024,460 | 3/1962 | Dahl et al. | 342/166 |
| 3,025,462 | 3/1962 | King | 342/166 X |
| 3,035,229 | 5/1962 | Guderian et al. | 342/173 X |
| 3,114,910 | 12/1963 | Rymes | 342/169 |
| 3,161,878 | 12/1964 | Quinlivan | 342/166 |
| 3,165,742 | 1/1965 | Taylor | 342/166 |
| 3,225,295 | 12/1965 | Altman et al. | 342/173 X |
| 3,229,093 | 1/1966 | Trautvetter | 250/351 |
| 3,246,244 | 4/1966 | Darrow et al. | 343/703 |
| 3,254,340 | 5/1966 | Sealander | 342/162 X |
| 4,083,238 | 4/1968 | Dick | 342/166 X |
| 4,467,327 | 8/1984 | Drake et al. | 434/2 X |
| 4,630,053 | 12/1986 | Green, Jr. et al. | 342/168 X |

Primary Examiner—Thomas H. Tarcza
Assistant Examiner—John B. Sotomayor
Attorney, Agent, or Firm—Lee & Smith

[57] ABSTRACT

A device constructed as simple as possible shall be provided for simulating, in laboratory tests of radar seekers, the conditions of free space with a moving target emitting radar radiation. To this end, a radar anechoic chamber is formed as hollow body pivotable about the radar seeker and serving as ray trap. A radar transmitter is arranged in this hollow body.

10 Claims, 2 Drawing Sheets

DEVICE FOR THE SIMULATION OF RADAR TARGETS IN LABORATORY TESTS OF RADAR SEEKERS

TECHNICAL FIELD

The invention relates to a device for the simulation of radar targets within the framework of laboratory tests of the behaviour of radar seekers or of multimode seekers having radar a channel,
(a) wherein, by a radar anechoic chamber, an environment for a radar seeker provided with a detector is achieved, which comes close to the conditions of free space with regard to the radar radiation measurable at the location of the detector, and
(b) in which means emitting radar radiations are arranged.

Particularly the device relates to the simulation of active radar targets.

BACKGROUND ART

For the testing of the behaviour of missiles provided with a seeker the so-called HWIL-simulation method is common (HWIL=Hardware-in-the-loop). Therein the seeker of a real missile is subjected to radiation, as it would receive it in real action. Then the reaction of the missile or of the seeker on this radiation is picked-off and, for example, applied to a computer, which simulates the aerodynamic behaviour of the missile. With this method the problem arises, to simulate the radiation, for example radar radiation, from the target received by the seeker in real action. In free space the radiation from the target impinges only in direct line upon the detector of the seeker. There are no walls or the like present, at which the radiation is reflected. These conditions have to be simulated in laboratory.

For this purpose, radar anechoic chambers are known. That are big halls, in which the total missile or seeker to be tested is arranged. The walls of these halls are provided with a plurality of tips arranged closely side-by-side. This shape of the walls prevents the radar rays emanating from a transmitter from being reflected at the walls into the direction to the seeker. This structure ensures, that radar rays are absorbed vere quickly by these walls. In this way the characteristic of free space not to provide radar echo is simulated.

Different methods are used in these radar anechoic chambers for the simulation of moving targets transmitting radar rays:

It is known to transform the movement of seekers and targets from the inertial reference system into the line-of-sight reference system and to electrically correct the signals in the seeker. With this method the target, that is the transmitter of the radar signals, is stationary. The movement of the target is simulated and thus is not represented physically. However, this solution does not take into account some problems of real seekers. It is not equivalent to an arrangement having a target actually moved in space relative to the seeker.

Furthermore it is known to physically move a radar transmitter relative to the seeker within a radar anechoic chamber by means of mechanical transport devices. The angular ranges of the line-of-sight possible to simulate in this way are rather limited. Large angular ranges, in which the line-of-sight is variable, require large dimensions of the anechoic chamber and expensive transport devices for the radar transmitter.

Furthermore a device is known, in which the movement of the target is simulated by phase controlled antennas in the anechoic chamber. Thus, an antenna serving as radar transmitter is not moved therein, but a row of stationary antennas is provided, which are controlled with regard to amplitude and/or phase, such that a moving apparent radiation center is obtained. Depending on the required line-of-sight angular range and on the required angular accuracy, this type of simulation of moved targets requires a very large number of expensive antennas (see U.S. Pat. Nos. 4,660,041 and 4,621,265).

Common to all of the known solutions is that they are very expensive.

It is the object of the invention to simulate, at a seeker responding to radar, the conditions of free space with a moving target emitting radar radiation, with an expenditure as low as possible.

It is a further object of the invention to simulate large azimuth and elevation angles of the line-of-sight with a device of the type defined in the beginning.

According to the invention this object is achieved with a device of the type defined in the beginning in that
(c) the anechoic chamber is formed by a hollow body pivotable about the radar seeker,
(d) the hollow body has such a shape, that it acts as ray trap,
(e) at least one radar transmitter is fixedly arranged in this hollow body.

Thus, there is not need for an expensive hall-like anechoic chamber, in which the seeker head is arranged, but a hollow body serves as anechoic chamber, which is movable around the seeker head. The shape of this hollow body is such that it acts as ray trap, that means that the radar radiation impinging upon the walls of the hollow body cannot be reflected in the direction towards the seeker head even if it is reflected by this walls. Thus "indirect" radar radiation or radar echo is safely prevented from reaching the seeker head, even if a relatively small and thus pivotable anechoic chamber is used. The radar transmitter is fixedly arranged in this hollow body. Relatively large angles of the line-of-sight of, for example, +60° in azimuth and elevation can be simulated with such a construction.

Modifications of the invention are subject matter of the sub-claims.

An embodiment of the invention will now be described in greater detail with reference to the accompanying drawings.

Figure 1:
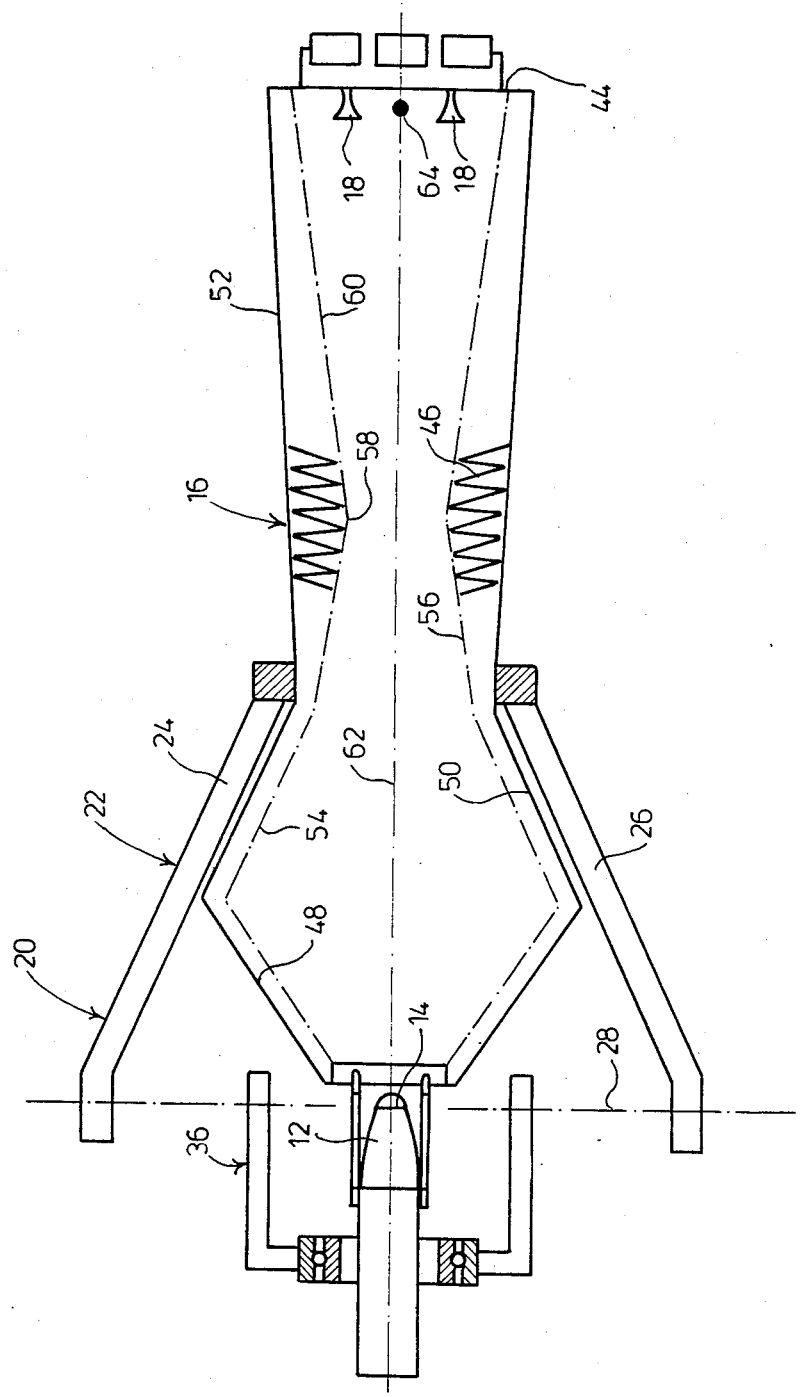
FIG. 1 shows schematicly a longitudinal sectional view through a device for the simulation of active radar targets within the framework of laboratory tests of the behaviour of radar seekers.
Figure 2:
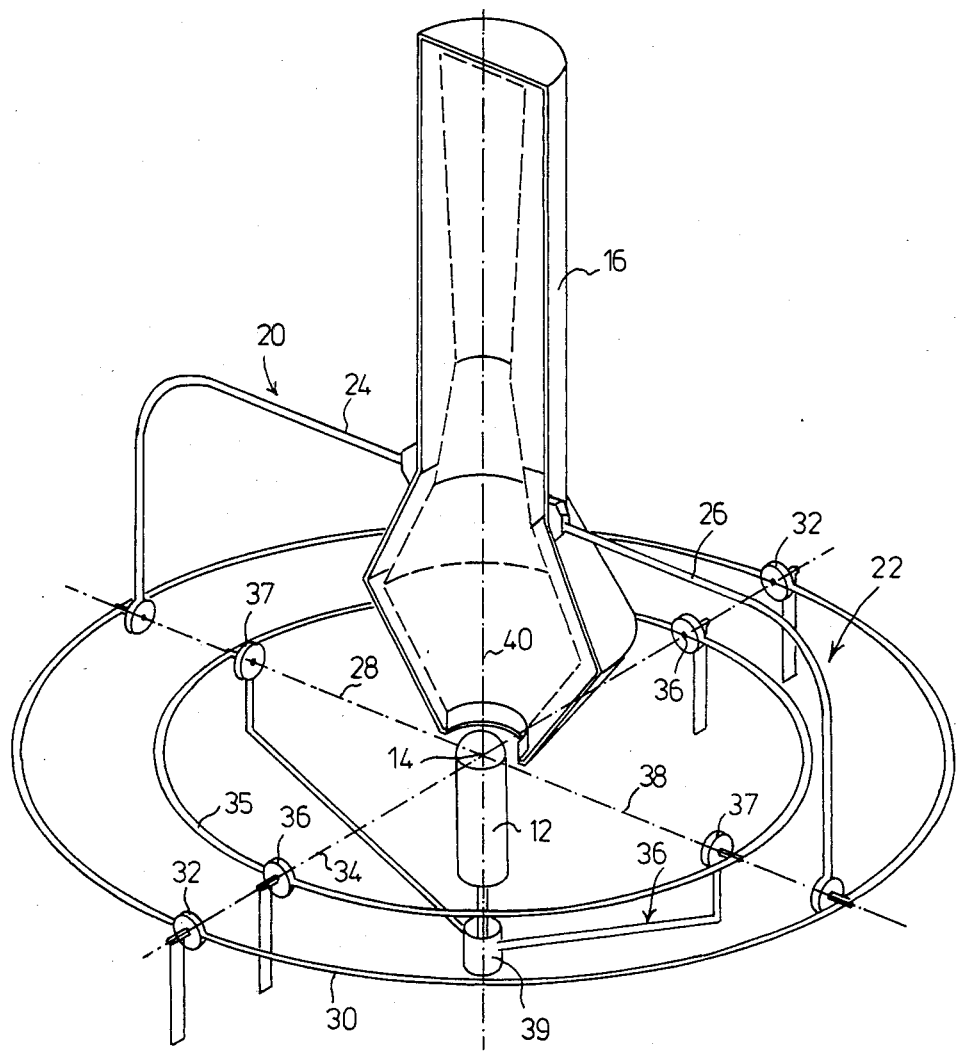
FIG. 2 shows schematic-perspectively the gimbal mounting of the seeker head and the anechoic chamber.

Numeral 12 designates a radar seeker head of a missile. The radar seeker head 12 comprises a radar seeker (not illustrated) provided with a detector. The radar seeker head 12 is gimbal suspended pivotably about a gimbal center point 14 in a way still to be described, and arranged to be aligned in known manner towards a target emitting radar rays. A radar anechoic chamber is provided for achieving an environment for the radar seeker, which comes close to the conditions of free space with regard to the radar radiation measurable at the location of the detector. Means emitting radar rays in the form of a radar transmitter are arranged in the anechoic chamber. The anechoic chamber is formed by a hollow body 16 pivotable about the radar seeker. As will be described in detail hereinbelow, the hollow body 16 has such a shape, that it acts as ray trap. At least one radar transmitter 18 is fixedly arranged in this hollow body 16.

The hollow body 16 is constructed of light weight materials. The hollow body 16 is mounted in a gimbal suspension 20. This gimbal suspension comprises a first gimbal 22, which is fixedly connected to the hollow body 16 and has two diametrically opposite arms 24 and 26. With these arms 24 and 26 the first gimbal 22 and the hollow body 16 are pivotably mounted about an axis 28 in a second gimbal 30. The second gimbal 30 is rotatably mounted in bearings 32 about the axis 34 relative to a stationary frame. The gimbal suspension of the seeker head 12 comprises an outer gimbal 35, which is rotatably mounted in bearings 36 about the axis 34 of the stationary frame. An inner gimbal 36 is mounted through bearings 37 in the outer gimbal 35 about an axis 38, which, in the illustrated center position, coincides with the axis 28. The seeker head 12 is rotatably mounted about an axis 40 in the inner gimbal 36 in a bearing 39.

The intersections of the axes 28 and 34 and of the axes 34 and 38 (gimbal center point 14) coincide. The intersection of the axes of the gimbal suspension 20, that is the intersection point of the axes 28 and 34, coincides with the gimbal center point 14 of the gimbal suspended radar seeker head 12.

The hollow body 16 is an elongated body of revolution, which has an opening 42 at one end on the side of the seeker and carries the radar transmitter 18 on a closed end surface 44 opposite this opening 42. Similar to the known radar anechoic chambers, the inner surface of the hollow body 16 is provided with a plurality of projections 46 inhibiting reflection.

Moreover, the hollow body 16 has, as mentioned, such a shape, that it acts as "ray trap". Radar radiation, which does not pass rectilinearly through the opening 42 but impinges upon the inner wall of the hollow body 16, is reflected at the inner wall by the shape of the hollow body 16, such that it does not pass through the opening 42 but is always reflected back into the hollow body 16. To this end, the inner surface of the hollow body 16 at first is flared starting from the opening 42 in a first section 48. Then the inner surface of the hollow body 16 is tapered in a second section 50 communicating with the first section. Finally the inner surface has an elongated third section 52, which is flared at a small angle up to the closed end surface 44.

In the first section 48 and in the second section 50 the envelope 54 of the projections 46 inhibiting reflection extends at a constant distance from the inner surface of the hollow body 16. In a first partial section 56 of the third section 52 the envelope 54 is tapered with a reduced cone angle with regard to the cone angle of the second section 50 up to a narrowest cross section 58. In a second partial section 60 of the third section 52 the envelope 54 is flared with a small cone angle from the narrowest cross section 58 towards the closed end surface.

In the embodiment schematicly illustrated in the figure, two radar transmitters 18 are arranged symmetrically to the longitudinal axis 62 of the hollow body 16 on the closed end surface 44. An infrared emitter 64 is located on the longitudinal axis 62. In this way a multimode seeker can be tested, which responds to radar as well as to infrared radiation.

Seekers exsist, which comprises a radar channel in centimeter or millimeter radar range as well as channels responding to other target radiations, for example to infrared radiation. With such seekers (multimode seekers) the problem of simultaneous simulation of the two target radiations arises. Then the apparent center points of the means emitting the two radiation types have to coincide exactly.

This is particularly favourable with a radar anechoic chamber of the described type, because herein the transmitters are fixedly arranged in the hollow body 16 serving as radar anechoic chamber and arranged pivotably relative to the seeker head 12. Therewith a further advantage of the described radar anechoic chamber is important: No lens systems are located between the seeker and the transmitter. Such "lenses", however, exist in the optical range also in the millimeter wave range. The disadvantage of such a millimeter wave lens would be that these lenses would be opaque for other radiation, for example for infrared radiation. Thus, the simultaneous simulation of a target in the radar and infrared ranges would not be possible.

In the described device, radar transmitter 18 and an infrared emitter 64 are arranged such that the apparent center points of the means emitting the two radiation types coincide. Then the seeker head "sees" a target, which emits radar radiation as well as infrared radiation from the same location. This target is moved relative to the seeker head by pivoting the hollow body 16, in which the radar transmitter 18 and the infrared emitter 64 are fixedly arranged. The radiation from the radar transmitter 18 and from the infrared radiator 64 directly impinges upon the seeker without focussing optical systems (lenses) interposed.

We claim:

1. A device for the simulation of radar targets within the framework of laboratory tests of the behaviour of radar seekers or of multimode seekers having a radar channel,
   (a) wherein, by a radar anechoic chamber, an environment for a radar seeker provided with a detector is achieved, which comes close to the conditions of free space with regard to the radar radiation measurable at the location of the detector, and
   (b) in which means emitting radar radiation are arranged,
   characterized in that
   (c) the anechoic chamber is formed by a hollow body pivotable about the radar seeker,
   (d) the hollow body has such a shape, that it acts as ray trap,
   (e) at least one radar transmitter is fixedly arranged in this hollow body.

2. Device as set forth in claim 1, characterized in that the hollow body is constructed of light weight materials.

3. Device as set forth in claim 1, characterized in that the hollow body is mounted in a gimbal suspension, the intersection of the axes of which is located in the gimbal center point of the gimbal suspended radar seeker.

4. Device as set forth claim 1, characterized in that the hollow body is an elongated body of revolution, which has an opening at one end on the side of the seeker and carries the radar transmitter on a closed end surface opposite this opening.

5. Device as set forth in claim 4, characterized in that the inner surface of the hollow body is provided with a plurality of projections inhibiting reflection.

6. Device as set forth in claim 5, characterized in that the inner surface of the hollow body
    (a) at first is flared starting from the opening in a first section,
    (b) then is tapered in a second section communicating with the first section, and
    (c) has an elongated third section, which is flared at a small angle up to the closed end surface.

7. Device as set forth in claim 6, characterized in that the envelope of the projections inhibiting reflection
    (a) in the first and the second section, extends at constant distance from the inner surface of the hollow body,
    (b) in a first partial section of the third section, is further tapered with a reduced cone angle as compared to the cone angle of the second section up to a narrowest cross section, and
    (c) in a second partial section of the third section, is flared with a small cone angle from the narrowest cross section towards the closed end surface.

8. Device as set forth in claim 1, characterized in that
    (a) further means emitting radiation are arranged in the hollow body in addition to radar transmitter means, and
    (b) the radiation from the radar transmitter means and from the further means emitting radiation directly impinges upon the seeker without focussing optical elements.

9. Device as set forth in claim 8, characterized in that the radar transmitter means and the further means emitting radiation are arranged, such that the apparent center points of the means emitting the two radiation types coincide.

10. Device as set forth in claim 2, characterized in that the hollow body is mounted in a gimbal suspension, the intersection of the axes of which is located in the gimbal center point of the gimbal suspended radar seeker.

* * * * *